United States Patent
Schleifstein et al.

(10) Patent No.: US 6,533,963 B1
(45) Date of Patent: Mar. 18, 2003

(54) ELECTRICALLY CONDUCTIVE FLEXIBLE COMPOSITIONS, AND MATERIALS AND METHODS FOR MAKING SAME

(76) Inventors: Robert A. Schleifstein, 27 Deborah Dr., Edison, NJ (US) 08220; Mohammad S. Abuelhawa, 718 Third St., Lyndhurst, NJ (US) 07071; Bruce C. Zimmerman, 3107 Smokeyhouse Ct., Freehold Township, NJ (US) 07728

( * ) Notice: Subject to any disclaimer, the term of this patent is extended or adjusted under 35 U.S.C. 154(b) by 0 days.

(21) Appl. No.: 09/250,031

(22) Filed: Feb. 12, 1999

(51) Int. Cl.$^7$ .............. H01B 1/00; H01B 1/06; H01B 1/02; H01B 1/04
(52) U.S. Cl. .............. 252/511; 252/500; 252/510; 252/506; 252/512; 252/513; 252/514; 252/518.1; 524/449; 428/242
(58) Field of Search ................ 252/511, 510, 252/500, 506, 512, 513, 514, 518.1; 524/449; 428/242

(56) References Cited

U.S. PATENT DOCUMENTS

| | | | |
|---|---|---|---|
| 3,140,342 A | 7/1964 | Ehrreich et al. | 174/35 |
| 3,194,860 A | 7/1965 | Ehrreich et al. | 264/154 |
| 3,279,905 A | 10/1966 | Wood et al. | 65/21 |
| 3,609,104 A | 9/1971 | Ehrreich et al. | 252/511 |
| 3,635,824 A | 1/1972 | Brandes et al. | 252/512 |
| 3,887,914 A | 6/1975 | Sato et al. | 340/384 |
| 3,887,918 A | 6/1975 | Bailey et al. | 343/17.2 |
| 3,907,537 A | 9/1975 | Irgens-Bergh | 65/142 |
| 4,046,548 A | 9/1977 | Wood et al. | 65/142 |
| 4,357,266 A | 11/1982 | Sado et al. | 252/512 |
| 4,500,447 A | 2/1985 | Kobayashi | 252/511 |
| 4,557,859 A | 12/1985 | Maeda et al. | 252/511 |
| 4,642,202 A | 2/1987 | Railsback | 252/511 |
| 4,765,930 A | 8/1988 | Mashimo et al. | 252/511 |
| 4,777,205 A | 10/1988 | LaScola et al. | 524/449 |
| 4,816,184 A | 3/1989 | Fukuda et al. | 252/511 |
| 4,822,523 A | 4/1989 | Prud'Homme | 252/511 |
| 4,836,955 A | 6/1989 | Ehrreich | 252/512 |
| 4,882,089 A | 11/1989 | Iwaskow et al. | 428/242 |
| 5,075,038 A | 12/1991 | Cole et al. | 252/514 |
| 5,091,114 A | 2/1992 | Nakajima et al. | 252/514 |
| 5,214,091 A | 5/1993 | Tanaka et al. | 524/425 |
| 5,227,093 A | 7/1993 | Colet et al. | 252/512 |
| 5,229,037 A | 7/1993 | Nakano et al. | 252/512 |
| 5,294,374 A | * 3/1994 | Martinez et al. | 252/518 |
| 5,344,593 A | 9/1994 | Chiba et al. | 252/514 |
| 5,384,075 A | 1/1995 | Okami | 252/511 |
| 5,430,085 A | 7/1995 | Acevedo et al. | 524/495 |
| 5,498,644 A | 3/1996 | Reo | 523/518 |
| 5,672,297 A | 9/1997 | Soane | 252/511 |

FOREIGN PATENT DOCUMENTS

| | | |
|---|---|---|
| DE | 4212950 | 10/1993 |
| DE | 4237990 | 5/1994 |

OTHER PUBLICATIONS

International Publication WO 840 1783, 84/05/10.
Database WPI, 83/05/28.

* cited by examiner

Primary Examiner—Yogendra N. Gupta
Assistant Examiner—D. G. Hamlin

(57) ABSTRACT

An electroconductive composition comprising an elastic matrix material and particulate filler material dispersed therein, the particulate filler material comprising fiber particles coated with a conductive material and spheroidal particles coated with a conductive material, the dispersion being such that the fiber-containing particulate filler and the spheroid-containing particulate filler are substantially interspersed, the particulate filler being present in an amount such that the conductive-material coated particles are in electroconductive relationship and such that the composition possesses enhanced flexibility, the conductive material being present in an amount sufficient that the composition has a decreased resistivity. The invention also encompasses a method of preparing these compositions comprising the steps of compounding said filler into a precursor of said flexible matrix material thereby dispersing said fillers throughout the matrix material, and curing the precursor to form the matrix.

46 Claims, No Drawings

ELECTRICALLY CONDUCTIVE FLEXIBLE COMPOSITIONS, AND MATERIALS AND METHODS FOR MAKING SAME

FIELD OF THE INVENTION

The invention relates to electronically conductive compositions which are flexible, materials for producing same which are readily formable, and methods for making same. The invention also relates to articles of manufacture formed of electrically conductive compositions, e.g., shaped articles and injection-molded articles, such as gaskets.

Several publications are cited to describe more fully the state of the art to which the invention pertains and are incorporated herein by reference.

BACKGROUND OF THE INVENTION

With continued advances in industrial technology and the general standard of living, the uses of electromagnetic energy have increased, and the number of sources for generating such energy has concomitantly multiplied. The leakage of electromagnetic radiation into the environment has become a significant problem.

For instance, technology requiring the channeling of electromagnetic energy in a pre-determined well-defined path, e.g., in wave-guide applications, is increasingly an important component of modern communications and other technologies. These wave-guide applications require quantitative confinement of electromagnetic radiation for the effective implementation of the selected technology. Leakage of the electromagnetic radiation can substantially interfere with achievement of the desired results.

Further, leakage of electromagnetic radiation is intrinsically damaging to life forms and other equipment occupying the same environment. Beyond having adverse influences on the human body, leaked radiation can also cause erratic behavior of and/or damage to integrated circuits and electronic equipment. For instance, electromagnetic waves radiated from electronic computers in various office equipment can interfere with the performance of television sets and audio equipment.

It has long been known that various electroconductive materials can be used to absorb or reflect electromagnetic waves, and thus to contain electromagnetic radiation or shield other systems or equipment from it. Examples are metals which can absorb or reflect electromagnetic waves, and plastics with such metals deposited thereon.

However, compositions which incorporate metallic conductive fillers in amounts sufficiently large to insure good electroconductivity can be subject to other difficulties. Both cost and specific gravity tend to be higher than desirable. The amount of filler needed to secure electroconductivity can also impinge upon flexibility of the compositions and the formability of precursor materials from which the compositions are made. (e.g., flowability such as moldability of a paste from which the composition is formed). It is known to replace metallic particles by particles comprising a non-metallic core or substrate coated by an electroconductive material. While this expedient can drive down costs and specific gravity, it is not trouble-free. This is because of the persistence of a fundamentally problematic dichotomy which has afflicted the introduction of conductive fillers into flexible matrix materials, namely: when the conductive filler is added in smaller amounts to preserve flexibility and formability, the conductive effect is undesirably diminished; however, when the filler is added in larger amounts for high conductivity, flexibility and formability (e.g., mechanical strength, moldability) are compromised.

By way of example, attempts at rendering polymeric materials electrically conductive have met with less than uniform success. Molding polymers in which conductive fibers are incorporated has been tried, but in order to achieve acceptable electrical conductivity so much fiber must be added that there is a marked decrease in certain other desirable polymeric properties (such as those pertaining to flexibility and/or formability). Silver or other metal flakes and metal-coated glass spheres have also been added to polymers but, again, very high loading levels are needed to achieve electrical conductivity, which becomes cost prohibitive for most applications and can interfere with the desired attainment of all properties.

More specific examples of the foregoing are as follows:

U.S. Pat. No. 3,140,342 describes a method used in making conductive plastic articles having radio frequency shielding capabilities. Metallic particles are mixed with the uncured phase of a compressible resin and the mass is then cured. Particle-to-particle contact provides numerous conductive paths through the cured article, with a resulting high conductivity. However, the cost of the conductive plastic is rather high because of the high concentration of metal therein, particularly when an expensive metal such as silver is used. Moreover, with a high metallic concentration, many of the desirable physical properties of the plastic are greatly attenuated. Thus, the finished article may not have as much tensile strength as desired, and its compressibility is significantly diminished by the large number of interconnecting metal particles.

U.S. Pat. No. 3,194,860 describes a method of preparing metal-filled conductive plastic gaskets wherein the flat gasket is die-cut from a sheet of plastic elastomer loaded with a conductive metal powder. The powder particles can be solid noble metal particles or non-noble metal particles such as iron or copper coated with noble metal coating such as silver or gold. Although using non-noble metal gaskets coated with silver or gold provides a less costly conductive plastic, high loadings which are frequently required to render the plastic conductive diminish other desirable physical properties of the plastic such as compressibility and tensile strength.

U.S. Pat. No. 4,500,447; U.S. Pat. No. 4,557,859; U.S. Pat. No. 4,642,202; U.S. Pat. No. 4,765,930; U.S. Pat. No. 4,822,089 and U.S. Pat. No. 5,430,085 describe electrically conductive compositions in which carbon is the electroconductive material. The carbon cited in these references can be carbon black conventionally used in electrically conductive silicon rubbers or as part of a system which includes other metals. The metals can be Al, Zn, Fe, Ni, Sn, Pb and Ag as spheres, platelets or whiskers. The carbon can be used as fibers or filaments, uncoated or coated with metal by electrodeposition. However, a highly electroconductive composition having a low volume resistivity is not readily achieved with such techniques. However, when loading polymers with carbon fibers in order to achieve acceptable electrical conductivity, so much carbon fiber must be added that there is a marked decrease in other desirable qualities such as polymer flexibility and precursor formability. Moreover, because of the large difference in resistivity between carbon and metals such as silver, polymers loaded with carbon fibers cannot provide the resistivity required for EMI shielding. Similarly, when carbon fibers coated with electrically conductive metal are used the resulting electrical conductivity is not uniform and continuous. This is caused in part by poor adhesion of the metal to the carbon fibers.

U.S. Pat. No. 5,214,091 describes silver coated glass beads, which are an example of conductive inorganic fillers modified for the purpose of simultaneously achieving acceptable conductivity at lower cost than solid noble metal particles and also avoiding the disadvantages associated with the use of carbon. However, in order to provide the desired conductivity, it is necessary to add an overly large quantity of conductive inorganic filler.

U.S. Pat. No. 5,672,297 describes the use of gel particles in a swollen state to form expandable and contractible matrices. The conductive composite articles made from these matrices can be used as "on-off" electrical switches. The matrix disclosed in this reference contains conductive filler particles of regular or irregular shape, such as bead, fiber or flake forms. A combination of two or more conductive filler particles described. Examples of filler particles include copper powder, silver coated nickel flakes, silver coated glass bubbles, solid glass beads, mica flakes and carbon powders. The resulting gel-matrix composite has high electrical resistivity and undergoes significant change in response to minor variations in one of several externally controlled thermodynamic parameters, such as temperature, pH, ionic strength, and solvent composition. The patent's teachings are inadequate to have taught the invention because the gel-matrix composites disclosed by it would not be useful for gaskets or as shielding against electromagnetic radiation, the addition of inorganic fillers tends to cause local variation of electroconductivity due to improper dispersion of fillers, and addition of large amounts of such inorganic fillers also impairs the flexibility and formability of the polymeric composition making it difficult to mold.

U.S. Pat. No. 4,816,184 discloses thermoplastic resin pellets used for molding into articles having electromagnetic wave shielding effect. The pellets have a core of glass fibers coated with metal which extends from one end of the pellet to the other. The core is surrounded by thermoplastic resin having other conductive powders, flakes or short fillers dispersed therein. However, in order to achieve a useful electrical conductivity, high loading levels are required. Moreover, fibers tend to align within a polymeric matrix causing stiffness in the resulting composition and a concomitant decrease in flexibility.

Of particular interest are conductive compositions having a silicone-based matrix system, which are valued for their superior elastomeric properties, but nevertheless have not been successfully made desirably highly conductive without diminishing flexibility as follows:

U.S. Pat. No. 4,777,205 is directed to an organopolysiloxane composition containing silver-coated mica particles and carbon black, a platinum catalyst, and a platinum-catalyst inhibitor, as well as semi or non-reinforcing non-conductive fillers include glass beads, bubbles or fibers. Note that mica is a material which cannot provide the level of resistivity required for gaskets useful in EMI shielding.

U.S. Pat. No. 4,357,266 discloses an electrically insulating polymeric material such as diorganopolysiloxane which incorporates a finely divided particulate or fibrils of metallic silicon. The matrix described in this reference incorporates a mono- or di-functional silicone to maintain resistivity when a molded rubber article is subjected to bending or vibrational stress.

U.S. Pat. No. 5,227,093 is directed to an organosiloxane composition (cured with a platinum catalyst) containing silver or silver-coated particles treated with a fatty acid ester prior to their incorporation.

U.S. Pat. No. 4,836,955 discloses a silicone binder system (having as a first component a vinyl gum type of silicone resin and as a second component a liquid silicone resin) containing silver-plated copper particles for use as a gasket, such formulation exhibiting improved electroconductive stability when the particles are subjected to a long-term heat treatment prior to their incorporation in the matrix. However, silver-coated copper particles provide a dense filler. In order to obtain a resistivity comparable to silver coated glass fillers, substantially more copper particles are required. As a result the flexibility and formability of the gasket are impaired. Moreover, silver coated copper particles are very expensive.

U.S. Pat. No. 5,075,038 describes a number of different embodiments, such as a siloxane silicone pressure-sensitive adhesive containing silver-plated copper powder, an electrically conductive stock comprising a mixture of siloxane polymer with a curing agent (aminosilane or aminosilazane) and electrically conductive particles having an outer surface of noble metal, vinyl-containing organopolysiloxanes and organopolysiloxanes having Si-bonded hydrogen atoms along with a catalyst and a conductive material, a polymeric composition (e.g., an epoxy resin, silicone, fluorosilicone, polyurethane or long-chain hydrocarbon) loaded with silver flakes, and a silicone composition formed using a platinum catalyst and silicone polymer including amounts of aromatic-containing radicals or ethylenically unsaturated hydrocarbon radicals (e.g., vinyl radicals, in addition to those commonly used as end blockers) as well as silver particles or silver-coated copper, solid glass, hollow glass, mica flakes, nickel granules and spheres, short glass and ceramic fiber.

Further, U.S. Pat. No. 5,229,037 describes multiple systems such as: a highly electroconductive silicone rubber composition containing noble metal powder or an inorganic material (for instance, glass, mica, alumina, carbon and the like) coated or plated with silver, nickel, etc.; a silicone rubber composition obtained by compounding a metallic electroconductivity-imparting agent with an insulating silicone rubber composition in combination with a fine powder or a cured silicone rubber (or alternatively carbon black); and an electroconductive composition comprising a diorganopolysiloxane, spherical particles of a cured silicone elastomer, a metallic electroductivity-imparting agent in finely divided form, and a curing agent, as well as (optionally) a liquid organosilicone compound.

The foregoing disclosures illustrate attempts at loading silicone rubber materials. In general, these materials have excellent heat and cold resistance and weatherability, as well as excellent electrical insulation properties so that they are widely used in a variety of applications. Electrically conductive silicone rubbers, having a volume resistivity of from $10^{-4}$ to $10^6$ ohm.cm, have been prepared by compounding an insulating silicone rubber precursor with a substantial amount of an electroconductivity-imparting agent, and curing to form the silicone rubber. Typically, gaskets or compositions intended for EMI shielding have a volume resistivity from $10^{-3}$ to $10^{-2}$ ohm.cm. However, though such rubbers are intrinsically adequately flexible in and of themselves, and are typically made from precursor materials that are adequately formable, at loading levels necessary to impart high conductivity to final products, those properties can be diminished unacceptably.

In summary: formability and flexibility are important considerations when the goal is to form flexible gaskets or seals useful for wave-guide assemblies, weather-tight R.F. enclosures and the like, or to form relatively lightweight shielding for protecting sensitive electronic devices from higher levels of electromagnetic radiation in the environment due to increased utilization of electronic equipment. For instance, returning to wave-guide applications, the materials utilized must exhibit high electrical conductivity and opacity to the electromagnetic energy in the wave-guide in order to act as an effective part of the wave-guide structure. Similarly, materials used as radio frequency shielding must be highly conductive and opaque to electromagnetic radiation at the frequencies concerned, in order to shield sensitive electronic instrumentation from extraneous electromagnetic energy which is ambient in the environment. But the properties of flexibility, and precursor-formability, are also important in each of the aforementioned application so that (for instance) a conductive article formed of such a material can be configured and/or maintained in contact with a manipulable element to provide the required zone of confinement of electromagnetic energy to the wave-guide path, or exclusion of the energy from the shielded components. (It will be understood that such properties are also important to achievement of a liquid or air-tight seal, for example, as provided by a flexible electroconductive gasket, between a pair of mating parts.) It is disadvantageously inherent in such materials heretofore prepared that there is a trade-off between flexibility on the one hand, and electrical conductivity on the other. As more electrically conductive filler is added to the matrix material, the conductivity of the material increases but the flexibility decreases. Moreover, high filler loadings thought necessary to achieve sufficient conductivity also limit a material's processing versatility, such as, its compatibility with injection-molding methods. Various attempts have been made to solve the above-described problems, but without satisfactory results.

A material which exhibits both good electroconductivity and good flexibility (or in the case of a precursor, good formability) as aforesaid would substantially advance the art.

OBJECTS OF THE INVENTION

It is an object of the invention to overcome the above-identified difficulties.

It is another object of the present invention to provide a material having good flexibility which is also electrically conductive.

It is yet another object of the present invention to provide a precursor material which has good formability and in respect of producing an electrically conductive flexible material therefrom.

It is further object of the present invention to provide methods of making and using the aforementioned compositions and precursor materials.

It is yet another object of the present invention to produce products formed from such compositions including gaskets, shaped articles, injection-molded articles, etc.

Various other objects, advantages and features of the invention will be readily apparent from the ensuing description.

SUMMARY OF THE INVENTION

In one aspect, the invention is an electroconductive composition which comprises an elastic matrix material and particulate filler material dispersed therein, said particulate filler comprising a multiplicity of particles having an elongate core or substrate coated with a conductive material and a multiplicity of particles having a spheroidal core or substrate coated with a conductive material. The dispersion of particulate filler material in the matrix material is such that the elongate particles and the spheroidal particles are mutually substantially interspersed, the total amount of the particulate filler, and the amounts of the elongate particles and spheroidal particles relative to one another being such that the conductive-material coated particles are in electromagnetic relationship and such that the composition is functionally flexible.

In another aspect, the invention is an electroconductive paste for forming a solidified flexible electroconductive composition, which paste comprises a precursor material formable into an elastic matrix material and particulate filler material dispersed in said precursor material, the particulate filler material comprising a multiplicity of particles having an elongate core or substrate coated with a conductive material and a multiplicity of spheroidal particles having a core or substrate coated with a conductive material, the elongate particles and spheroidal particles being mutually substantially interspersed, the total amount of the particulate filler and the amounts of the elongate and spheroidal conductive particles relative to one another being such that, when the precursor material is formed into the matrix, the conductive-material coated particles are in electroconductive relationship, and the composition is functionally flexible.

In an additional aspect, the invention is a multiplicity of electroconductive particles comprising a first portion of particles consisting essentially of an elongate core or substrate coated with an electroconductive material and a second portion of particles consisting essentially of a spheroidal core or substrate coated with an electroconductive material, the two portions of particles being mutually substantially interspersed, the amounts of the elongate particles and spheroidal particles relative to one another being such that, when the particles are incorporated in a composition consisting essentially of such particles and a substantially non-conductive flexible matrix material in an amount effective to confer electroconductivity on the composition, the composition also exhibits functional flexibility.

In a further aspect, the invention is, as an article of manufacture, a shaped element comprising an electroconductive composition, which includes an elastic matrix material and particulate filler material dispersed in the matrix material, the particulate filler material comprising a multiplicity of particles having an elongate core or substrate coated with a conductive material and an multiplicity of particles having a spheroidal core or substrate coated with a conductive material, the elongate conductive particles and the spheroidal conductive particles being mutually substantially interspersed, the total amount of the particulate filler and the amounts of the elongate and spheroidal particles relative to one another being such that they are in electroconductive relationship, and the composition also exhibits functional flexibility.

In yet another aspect, the invention is a method of making an electroconductive composition, which includes compounding into a precursor of a flexible matrix material a particulate filler material including a multiplicity of elongate particles having a core or substrate coated with a conductive material and a multiplicity of spheroidal particles having a core or substrate coated with a conductive material, such that the elongate particles and the spheroidal particles are mutually substantially interspersed in the precursor; thereafter the precursor is cured to form the matrix; the amount of the total particulate filler and the amounts of the elongate conductive particles and spheroidal conductive particles relative to one another being such that the conductive-material coated particles in the composition after curing are in electroconductive relationship, and the composition is functionally flexible.

In still another aspect, the invention is a method of making an electroconductive paste for forming a solidified flexible electroconductive composition, which includes compounding into a precursor material, that is formable into a flexible matrix material, a particulate filler material including a multiplicity of elongate particles having a core or substrate coated with a conductive material and a multiplicity of spheroidal particles having a core or substrate coated with a conductive material, such that the elongate particles and the spheroidal particles are mutually substantially interspersed in the precursor. The total amount of the particulate filler and the amounts of the elongate particles and spheroidal particles relative to one another being such that, when the precursor material is formed into the matrix, the conductive-material coated particles in the composition are in electroconductive relationship, and the composition exhibits functional flexibility.

The invention is useful for providing shielding, conductive components, electrostatic charge dissipation elements, and other articles of manufacture in which good electroconductivity and flexibility are necessary or advantageous.

Practice in accordance with the invention results in appreciable advantages. Good conductivity is achieved through the incorporation of a substantial amount of particulate conductive filler. Additionally, economy is achieved through the utilization of conductive filler materials which are largely composed of one or more relatively inexpensive substances, typically functioning as a core or substrate, covered substantially entirely or in effective part with an electroconductive material which is usually (though not necessarily) more expensive than the aforementioned substance(s). In this manner, the amount of more expensive material can be reduced in comparison to embodiments in which the conductive filler is composed completely (or mostly), of one or more relatively expensive electroconductive substances. By the same token, the particulate conductive filler of the invention can be formulated such that its specific gravity is relatively lower than that of solid metal fillers, with the beneficial result that the specific gravity of compositions loaded with the filler of the invention is also lower. And, despite use of appreciable amounts of particulate conductive filler to secure the advantages mentioned above, the invention nevertheless also provides a way of maintaining to an effective degree flexibility of a matrix material, and the intrinsic formability of a precursor paste, in which the filler is dispersed.

Consequently, by practicing within the invention all of the competing concerns discussed in preceding paragraphs can be resolved.

DESCRIPTION OF CERTAIN PREFERRED EMBODIMENTS OF THE INVENTION

Preliminarily, it will be appreciated that the matrix materials utilized in the instant invention are fittingly those used in applications for which flexibility is desired, or those otherwise demonstrating elastomeric properties. Such materials include rubbers such as fluorosilicone, EPDM (ethylene propylene diene monomer) and thermoplastic polyurethane. Of particular interest are silicone-based matrix systems, which are valued for their elastomeric properties. Silicone based materials enable production of shaped electroconductive bodies suitable for applications requiring high flexibility. Depending on the formulation of the matrix, these can be used to form articles of manufacture such as conductive gaskets, shieldings, conductive adhesives, and the like.

The matrix is formed from a curable precursor material. This material is typically a substance or substances (e.g., a system) which, upon being subjected to condition such as catalysis, heat, irradiation with ultraviolet light or the like—can be converted to a solidified flexible material. In and of themselves, the selection and processing of precursor materials for formation into the matrices useful in practicing the invention are known in the art. By way of example, see generally the disclosures discussed above in the "Background of the Invention". One of ordinary skill, once equipped with the teachings herein, will be able to adapt such knowledge of precursor materials to the practice of the invention without undue experimentation or further invention.

The especially interesting polysiloxane matrix materials mentioned above are formed from a precursor curable siloxane system and typically comprise a non-conductive polymeric substance in which the electroconductive filler material can be dispersed to impart electroconductivity. The term "polysiloxane" refers to the principal component of the polymeric substance, but does not foreclose the presence of other substances. Thus, a polysiloxane matrix contains a plurality of different siloxane units, each repeating throughout the material, such units typically being substituted by one or more organic radicals, along with other components such as a curing agent, a catalyst, or one or more catalyst-inhibitors, and ingredients to improve the processability of the curable precursor system or one or more of the properties of cured material prepared from such system. Additional ingredients in this last category include but are not limited to reinforcing fillers such as finely divided silica, non-reinforcing fillers, filler treating agents, adhesion promoters, flame retarding agents, heat stabilizers, pigments and dyes. Depending upon the degree of polymerization, the viscosity of the precursor siloxane component utilized in the curable system can range from that of a flowable liquid to that of a relatively viscous gel or resin, though it is important in certain good embodiments of the invention that the precursor have sufficient formability so that it can be utilized in injection-molding operations and the like. The siloxane components selected will depend upon the desired processes and curing conditions in addition to the physical properties sought in the cured matrix. As indicated heretofore, polysiloxane matrix technology including the formation thereof from a siloxane component is, in and of itself known, and one of ordinary skill will be able to select suitable matrix materials, depending on the physical properties desired, and precursor siloxane components for making same without undue experimentation or further invention.

In yet other good embodiments of the invention, fluorosilicones are used. This affords the advantages of both silicones and fluorocarbons (silicones are discussed in the preceding paragraphs; fluorination of compounds often enhances their thermal stability). In the case of siloxanes, fluorination usually begins at the gamma position of a substituent alkyl chain (due to the electropositive nature of silicone, fluorination at the alpha and beta positions can result in poor thermal stability). Consequently, commercial fluorosilicones are frequently trifluoropropyl-substituted methyl materials.

Examples of silicone-based matrix materials useful in the present invention are: elastomeric thermoplastic polyblock organopolysiloxane copolymer (formed in a reaction catalyzed by platinum chloride derivatives) as described in U.S. Pat. No. 4,822,523; organopoly-siloxanes as described in U.S. Pat. No. 4,777,205 and U.S. Pat. No. 5,227,093; a silicone binder system having as a first component a vinyl gum type of silicone resin and as a second component a liquid silicone resin as described in U.S. Pat. No. 4,836,955; a siloxane silicone pressure-sensitive adhesive, an electrically conductive stock comprising a mixture of siloxane polymer with a curing agent (aminosilane or aminosilazane), vinyl-containing organopolysiloxanes and organopolysiloxanes having Si-bonded hydrogen atoms, a polymeric composition (e.g., an epoxy resin, silicone, fluorosilicone, polyurethane or long-chain hydrocarbon), and a silicone composition formed using a platinum catalyst and silicone polymer including amounts of aromatic-containing radicals or ethylenically unsaturated hydrocarbon radicals (e.g., vinyl radicals, in addition to those commonly used as end blockers), all as described in U.S. Pat. No. 5,075,038.

Also useful for the matrix of the invention are multiple systems such as: a highly electroconductive silicone rubber; a silicone rubber composition obtained in pertinent part by compounding an insulating silicone rubber composition in combination with a fine powder of a cured silicone rubber (or alternatively carbon black); and a composition comprising a diorganopolysiloxane, spherical particles of a cured silicone elastomer, and a curing agent, as well as (optionally) a liquid organosilicone compound, all as described in U.S. Pat. No. 5,229,037. Additionally useful for the matrix of the invention are: a vinyl-group-terminated polydimethylsiloxane, optionally containing other polymer components and a hydrosilyl-group-containing polydimethylsiloxane to act as a curing agent, as described in U.S. Pat. No. 5,344,593; a system comprising an organopolysiloxane having at least two alkenyl groups in its molecule, an organohydrogen-polysiloxane having at least two silicone-bonded hydrogen atoms in its molecule, a platinum group metal catalyst, an organosilicone compound having at least one silicone-bonded hydrogen atom and at least one silicone-attached epoxy-group-containing organic group or alkoxy group, as disclosed in U.S. Pat. No. 5,384,075; a silicone elastomer produced, for instance, by mixing vinyl-methylsiloxane having a platinum catalyst with methylhydrogensiloxane, a Teflon powder and a heat curable silicone rubber system containing an inhibited platinum catalyst, as disclosed in U.S. Pat. No. 5,498,644; and a composition produced by removing water from an emulsion having a dispersed phase of elastomer (e.g., based upon polydiorganosiloxane) and a continuous phase of water, as disclosed in U.S. Pat. No. 5,091,114.

In certain good embodiments of the present invention, the electroconductive compositions of the invention also contain inorganic fillers such as ordinary silica powder, colloidal silica, aerogel silica, alumina or the like. Such filler materials typically have a reinforcing function, with a surface area of at least 50 $m^2/g$ and/or pyrogenically produced silicon dioxide. The inclusion of such material confers upon the uncured mixture sufficient thixotropy higher viscosity and improved dispersion stability of the electroconductive particles, and also can confer improved strength upon the cured composition. In addition, in some further embodiments of the invention it can be advantageous to include fillers that are semi- or non-reinforcing, i.e., fillers which have a surface area of less than 50 $m^2/g$. Examples of semi- or non-reinforcing fillers are metal oxides, metal nitrides, glass beads, bubbles or fibers, metallic flakes, powers and fibers such as copper, nickel and aluminum cork, organic resins, polytetrafluoroethylene, polychlorotrifluoroethylene, polyvinylcholoride, bentonite, diatomaceous earth, crushed quartz, mica, and mixtures thereof. These filler materials may be treated with, for example, trialkylalkoxysilanes, such as trimethylethoxysilane, to coat the surfaces with organosiloxy groups.

Other additives which can be incorporated in the conductive compositions of the invention include pigments, compression set additives, oxidation inhibitors, plasticizers, adhesion promoters, base stabilizers and other materials commonly employed as additives in the silicone rubber art. Also, the conductive composition of the invention can contain a heat resistance improver such as cerium oxide, a flame retardant, and non-functional organopolysiloxanes to enhance thermal shock resistance, flexibility and the like of the cured composition.

In line with the preceding disclosure, curing techniques are known in and of themselves. Thus, curing is often implemented by incorporating in the precursor material is a suitable catalyst component for the addition reaction, for instance to act as a cure accelerator. Such catalysts are also, in and of themselves, known and one of ordinary skill once in possession of the teachings herein will be able to select appropriate catalysts to achieve the desired curing, without undue experimentation of further invention. For instance, the catalyst can be any curing catalyst suitable for the matrix precursors used in the compositions of the invention. In the present invention mobile metal catalysts and organo peroxide catalysts are among those preferred. Useful noble metal catalysts include platinum and paladium for extrusion; useful organo peroxide catalysts include dicumylperoxide, dibenzoyl peroxide and MEK (methyl ethyl ketone) peroxide.

The method of addition of the curing catalyst is not critical. The catalyst can be mixed with the siloxane component(s) in advance, for the purpose of storage stability, prevention of even catalyst distribution, etc. The catalyst is frequently incorporated in the reaction mixture at room temperature, although the catalyst can be added at elevated temperature if desired. The amount of catalyst can be determined by one of ordinary skill without the exercise of further invention once equipped with the teachings of this invention. This amount is typically based on the desired actual curing rate, working life, and the like.

A central feature of the present invention is the utilization of a particulate filler material with both elongate and spheroidal conductive particles. Each different particle shape, included in a suitable amount, is important to the realization of the advantages conferred by the invention. On the one hand, elongate shapes are highly beneficial in that their use should result in a reduced volume of relatively rigid filler material in the composition (and precursor material) if properly distributed. Unfortunately, with use of elongate shapes comes also the danger of alignment and thus stiffness tending to decrease the desired flexibility and formability. On the other hand, though incorporation of spheroidal particles minimizes the occurrence of directional alignment, conduction between respective spheroids is substantially point-to-point in nature, and entails the presence of a much greater amount of rigid filler material to achieve conductivity than with elongate particles. This not only increases the amount of conductive metal needed, but also reduces the amount of matrix material, which tends to detract from formability and flexibility. The problem is solved by the present invention. Inclusion of elongate conductive particles in combination with spheroidal conductive particles is believed to result in an advantageous disorientation of elongate particles to promote formability and flexibility. That is, whereas elongate particles incorporated alone into polymeric matrices tend to orient along a single axis, elongate particles incorporated into polymeric matrices in the presence of spheroidal particles tend to be randomly dispersed, or at least sufficiently less oriented that the composite material does not stiffen to a deleterious extent. Thus, formability and flexibility are maintained at relatively high levels. This is accomplished while nonetheless achieving a relatively low-cost, highly electroconductive composition, and a precursor material from which such composition can be produced.

The use of spheroidal particles together with elongate particles further results in a composition having superior dimensional uniformity and stability as compared with compositions employing solely elongate particles. For instance, the physical effects of elongate particle orientation in accordance with the invention are significant. Elongate particles oriented along a single axis cause stiffness along that axis selectively. Disorientation of elongate particles prevents aggravated stiffening along any one axis, and instead effectively breaks up and distributes the elongate particles' stiffening effect uniformly throughout the matrix, which contributes to flexibility. Such disorientation also results in a more uniform electroconductivity and resistivity.

The aforementioned properties are achieved through dispersal in a suitable matrix of a mixture of spheroidal conductive particles and elongate conductive particles. That the elongate particles and spheroidal particles are "mutually substantially interspersed" shall mean, for purposes of the instant description, that the elongate particles are distributed more or less evenly among the spheroidal particles, and vice versa. This condition occurs in accordance with the invention not only when the particles are mixed together in the absence of a matrix material or precursor thereof, but also when the particles are contained in that material or a precursor material. By achieving this interspersion, the advantages of the invention can be realized. Of course, there may be local variations, wherein the particulate filler material is uncharacteristically concentrated or sparse, but these sites should be confined in size and number such that the good properties which are conferred by practice of the invention are not lost.

The term "particle" or "particulate" as used herein refers to a small, discrete quantity of matter; while these particles are spheroidal or elongate, they need not be entirely symmetrical, and indeed can be irregular in shape at various different locations, as long as the general elongate and spheroidal configurations, respectively, are preserved. Typically, the particle comprises a core or substrate of a suitable filler material and deposited thereon a suitably electroconductive material. The shape of a conductive particle is determined by the configuration of such core or substrate. Thus, the elongate particles comprise a core or substrate of riii length greater than either width or thickness. It is preferable that the elongate core or substrate be in the form of a rod or fiber. Likewise, the spheroidal conductive particles comprise a spheroidal core or substrate made of appropriate filler material and a deposit of electroconductive material on the exterior. It is preferable that the spheroidal core or substrate be spherical or substantially spherical, for instance, a spherical or substantially spherical bead.

The elongate particles are any suitable filler material, and typically are fibers of an inorganic substance. Similarly, the spheroidal particles are any suitable filler material; they are typically beads of an inorganic substance. The core or substrate of each electroconductive particle is suitably an inorganic non-metallic material. This can be any of a wide range of materials which exhibit properties and physical characteristics consistent with attainment of the objectives of this invention. In this connection, it will be understood that "non-metallic" properties and physical characteristics are exhibited. Suitable materials typically display non-electroconductive properties. Accordingly, these materials are, typically, glasses, ceramic substances and naturally occurring mineral substances. The following are examples of the foregoing materials: oxides, such as bauxite, corundum, ilmenite, brookite, anatase, rutile and magnetite, and hydroxides such as brucite, sulfides such as galena, pyrite, chalcopyrite and sphalerite; halides, such as sodium chloride, sylvite and fluorite; carbonates such as calcite, magnesite and siderite, nitrates, such as sodium nitrate, and borates, such as borax and kernite; sulfates, chromates and molybdates, examples being celestite, anhydrite and gypsum; and phosphates, such as bivianite, apatite and pyromorphite, arsenates such as erythrite, and vanadates, such as bavanadinite. Additional examples of suitable materials are conveniently classified into categories as follows: the tectosilicates, including the silica group, the feldspar group, the feldsparthoid group, the zeolite group; the philosilicates, including kaolinite, talc and vermiculite and the mica group, for instance muscovite, phlogovite and biotite; the inosilicates including the amphibole group, for instance the cummingtonite series, the pyroxene group, including the hypersthene series, for instance spodumene, and the pyroxenoid group; the cyclosilicates including beryl and tourmaline; the sorosilicate group, for instance, idocrase; the neosilicates, including the olivine series, such as magnesium iron silicate, and also including willemite; the aluminum silicate group; the garnet group; and silicates of indeterminate structure such as prehnite, chrysocolla and dumortierite. It will be understood that synthetic, as well as naturally occurring, inorganic non-metallic materials are suitable for practicing this invention.

The elongate core or substrate is typically a fiber. Its processing can often be accomplished without the more rigorous conditions that frequently are attendant upon spheridization. On the other hand, the spheroidal core or substrate is typically a bead. To spheroidize a material often necessitates its heating to fairly high temperatures, and at such temperatures some of the foregoing materials, for example, some among the hydroxides, sulfides, halides, carbonates, nitrates and sulfates, may be converted to oxides. Accordingly, speridization of these materials can only be accomplished with care, if at all.

In embodiments wherein the conductive particle core or substrate is glass it is typical to use lime glass, a soda-lime silicate glass composition known in the art. However, the core or substrate can also suitably be made of titanium glass, or other more highly refractory glass, for applications requiring special properties such as thermal resistance, low alkali content and the like.

In general, an inorganic non-metallic material selected for use as a particle core or substitute must be such that the particles do not soften, or appreciably distort in shape, under processing conditions to which the precursor material of this invention is subjected in making an electroconductive body therefrom.

The particles of inorganic non-metallic material are produced in any suitable manner. As an example, a suitable method for producing appropriate fibers is by extrusion through spinerettes. By way of further example, a suitable method for producing glass beads is to introduce crushed glass particles into a vertically disposed draft tube. The tube has a source of heat near its lower end, normally a well-distributed gas flame produced by a series of burners. As the combustion gases rise, they proceed into an expansion chamber and carry with them the glass particles which become soft, so that by surface tension the particles are shaped into spherical form. The beads are then cooled and collected. Various bead-producing systems are discussed in detail, for example, in U.S. Pat. No. 3,279,905, granted Oct. 18, 1956 to Thomas K. Wood et al., U.S. Pat. No. 3,887,914, granted Apr. 15, 1975, to Ib Von Irgensbergh, U.S. Pat. No. 3,887,918, granted Apr. 15 1975, to Thomas A Cerbo, U.S. Pat. No. 3,907,537, granted Sep. 23, 1975, to Ib Von Irgensbergh, and U.S. Pat. No. 4,046,548, granted Sep. 6, 1977, to Thomas K Wood et al.

Coating of the inorganic non-metallic particles is suitably effected by numerous means known in the art. For example, the silver-coating is applied by fluidization via dry or wet methods, by electroless plating, and the like. See, for instance U.S. Pat. No. 4,777,205 granted to LaScola, U.S. Pat. No. 4,822,523 granted to Prud'Homme, U.S. Pat. No. 4,836,955 granted to Ehrreich, 5,075,038 granted to Cole, et al., and U.S. Pat. No. 5,227,093, granted to Cole, et al.; U.S. Pat. No. 5,229,037 granted to Tanaka et al.; and U.S. Pat. No. 3,635,824, granted to Raymond G. Brandes et al.

As indicated above, each type of particulate filler is rendered conductive by depositing thereon a layer of an effective amount of conductive material. The conductive material is any suitable conductive substance, and can be, for instance a metal, metal alloy or other metal-containing substance. Thus, the electro-conductive material is preferably a noble metal or other conductive metal, an alloy of two or more of those metals, or an electroconductive compound, polymer or other substance containing one or more of such metals. Especially preferred are noble metals such as gold, silver, platinum, palladium, as well as other conductive metals such as nickel, iron, copper, zinc, chromium, cobalt and aluminum.

In accordance with the foregoing, the conductive spheroidal particles are preferably conductive metal-coated glass beads, especially silver-coated glass beads, which are substantially spherical in shape. Typically, the spheroidal particles, including the outer layer of conductive material, are of a size, from about 10 microns to 100 microns in average diameter. Such particles having an average diameter from 30 microns to 70 microns are especially preferred.

The spheroidal particles are generally coated with a conductive metal in an amount from 8% by weight to 24% by weight, preferably in an amount from 12% by weight to 20% by weight.

Similarly, the conductive metal-coated elongate particles useful in the present invention are preferably conductive metal-coated glass fibers. Typically, the elongate particles, including the outer layer of conductive material, have a diameter from 1 micron to 50 microns, preferably from 10 microns to 20 microns and most preferably 16 microns. The elongated particles have a length from 1/64 inches to 1/16 inches, with 1/32 inch preferred. Especially preferred elongated particles have a diameter of 16 microns and a length of 1/32 inches. On average, the elongate particles have an aspect ratio from 40:1 to 320:1, wherein an aspect ratio greater than 80:1 is preferred.

The elongate particles can be coated or plated by any known means with conductive material, preferably metals as described above. The amount of metal coating on the elongate particles varies from 15% by weight to 30% by weight, preferably from 20% by weight to 27% by weight. In certain highly preferred embodiments the elongate particles are silver-coated glass fibers wherein silver is found in an amount from 15% by weight to 30% by weight, and most preferably from 20% by weight to 27% by weight.

The aforementioned components of the particulate filler are utilized (a) in an aggregate amount, and (b) in amounts relative to one another, such that the above-discussed properties is secured. More specifically, the amount of filler is such that the desired good conductivity can be realized. Typically, the conductive material is present in an amount sufficient that the composition has a resistivity of no more than 20 mohm.cm. It is important that this be accomplished using electroconductive filler which is in large part inorganic material that is less costly and that is less dense than filler which is principally metallic. At the same time, the relative amounts of, respectively, spheroidal and elongate conductive particles are such that the composition containing them is adequately flexible.

As will be appreciated, it is impractical to provide a strictly numerical measure of the overall efficacy of the invention in preserving flexibility to the extent necessary for the electroconductive composition to perform successfully in the desired application, vis-a-vis the flexibility of the material when it is not loaded with conductive particulate filler. What is acceptable will vary from one application to another, etc. That said, it is nonetheless clear that the electroconductive composition will need to exhibit the requisite minimum amount of flexibility in order that it is suitable in practice. The invention enables attainment of this minimum amount of flexibility. Since that amount changes depending on the circumstances of use, and cannot be expressed as one common numerical parameter, the condition of exhibiting flexibility in at least the requisite minimum amount shall be referred to herein as being "effectively flexible". One of ordinary skill in the relevant art will be capable (without undue experimentation or further invention) of identifying, at least empirically, the minimum flexibility necessary under any particular set of circumstances, and accordingly will readily understand the term "effectively flexible". More specifically, the amount of particulate filler is sufficient to realize good conductivity (as indirectly measured by resistance), but does not significantly diminish flexibility vis-a-vis that of the matrix material alone (measured indirectly by Durometer hardness, or by other measures of physical and structural integrity). The conductive filler can be included in any aggregate amount appropriate for a desired application. Once in possession of the teachings herein, one of ordinary skill in the art can determine such amount as a routine matter and without the need for innovation, invention or the like.

When a blend of conductive elongate and spheroidal particles is used as the filler material for the compositions of the invention, it has been unexpectedly found that the conductive elongate particles and conductive spheroidal particles must be present in certain amounts relative to one another such that the conductive material coated particles are in electroconductive relationship while the necessary degree of flexibility of the matrix is still retained. The ratio of elongate (for example, fiber-based) particles to spheroidal (for example, bead-based) particles is selected to tailor the composition to secure the desired flexibility. The relationship between the conductive elongate and conductive spheroidal particles can be expressed as a ratio by weight which varies from 2:1 to 4:1, preferably 3:1.

The total conductive loading of the compositions of the invention is also very important. Electroconductive compositions containing only spheroidal particles as the filler of material provide good (low value) resistivity. However, the flexibility of the matrix as reflected by high Durometer hardness values is low and not desirable for many applications. Moreover, to achieve good resistivity only with spheroidal particles as the filler material fairly high total conductive loadings are necessary. For example, total conductive loadings below 69% by weight, utilizing only spheroidal particles as the conductive material, do not impart adequate conductivity. But, surprisingly it has been found that when a blend of elongate and spheroidal particles in conductive relationship is used, good resistivity values can be obtained with lower total conductive loadings than would otherwise be thought necessary if only spheroidal particulate for an al bead conductive filler material is used. The total conductive loading for the compositions of the invention can vary from 40 weight percent to 69 weight percent, preferably from 50 weight percent to 60 weight percent, and more preferably from 50 weight percent to 55 weight percent. It will be understood that the foregoing can lead to cost economics and lower specific gravity.

The goal of the present invention is to provide compositions which exhibit superior properties, among other things including good electroconductivity and good flexibility. Electroconductivity and can be measured in terms of resistivity, with a low resistivity being indicative of high electroconductivity, and vice versa. Flexibility can be measured as Durometer hardness, with lower Durometer values corresponding to more flexible, less stiff composites.

Electroconductive compositions in accordance with the present invention show excellent initial resistivity, typically in a range from 10 mΩ.cm up to but not including 200 mΩ.cm at an average durometer hardness of from 50 to 70 on the "D" scale. In certain good embodiments, the electroconductive composition has a resistivity of no more than 20 mΩ.cm and an average Durometer hardness of no more than 70 on the "D" scale. Other good compositions show similar resistivity at an average Durometer hardness which is 8% to 30% less than the flexible matrix material containing only spheroidal particles sufficient to provide resistivity comparable to that of the compositions of the present invention.

A further important advantage of the invention is that the precursor material has favorable rheological properties. Thus, it exhibits sufficient flowability or other deformability that it can be formed as necessary to permit configuration of the electroconductive composition into a desired shape. The precursor material is typically in the form of a paste, but can also be a liquid in certain embodiments.

It is not practical to provide a strictly numerical measure of whether a precursor material is formable, or instead too viscous, stiff or otherwise unyielding. As will be appreciated, what is acceptable will vary from one application to another, etc. However, it is apparent that one of ordinary skill in the art will know for any particular set of conditions, whether or not a specific precursor material exhibits suitable formability. Practice of the invention enables achievement of such formability. For purposes of simplicity in expression then, the condition of exhibiting sufficient formability that the precursor material can be configured as desired shall be referred to herein as being "effectively formable". One of ordinary skill in the relevant art will be capable (without undue experimentation or further invention) of identifying, at least empirically, the minimum formability necessary under any particular set of conditions, and accordingly will readily understand the term "effectively formable".

EXAMPLES

The following examples serve to provide further appreciation of the invention, but are not meant in any way to restrict its effective scope. Physical properties were measured at room temperature, unless otherwise stated or clear from the context.

Materials and Methods

Certain of the examples hereinafter described demonstrate my invention and therefore involve the use of both spheroidal conductive particles and elongate conductive particles. Other of the examples demonstrate control embodiments in which either spheroidal or elongate conductive particles, but not both, were utilized.

For all the following examples physical properties such as initial resistivity and hardness were measured on strips cut from gaskets made from the electroconductive composition of the present invention.

Several different grades of silver covered glass beads were used as spheroidal conductive particles in the example embodiments. These were grade numbers S-3000-S2, S-3000-S4, S-3000-S5 and S-2530-S4, all commercially available from Potters Industries, Inc. The S-3000 series particles comprise glass beads having an average diameter of 30$\mu$ while the S-2530 series particles comprise glass beads having an average diameter of 66$\mu$. The silver coating on the glass beads was 8%, 16% and 20% by weight for grades S-3000-S2, S-3000-S4 and S-3000-S5, respectively. The silver weight % content for S-2530-S4 was 16% by weight.

Silver-coated glass fibers were used as the conductive elongate particles in the example embodiments. The coated fibers used were Fibertec T-3082, T-3032 and T-3016 particles, all commercially available from Potters Industries Inc. The T-3082 and T-3032 coated fibers are of 16$\mu$ diameter, and the T-3016 particles of 10$\mu$ diameter. The T-3016 coated fibers are of length 1/16 inch, and the T-3082 coated fibers of length 1/32 inch. The bulk density of T-3032 was different from that of T-3082. The fibers had an aspect ratio of from about 50:1 to about 160:1.

The tested gaskets were prepared by mixing samples of SE-6370 and SE-6350 silicone rubber as available from General Electric Co. with silver coated glass fibers and/or silver coated beads as described above. A curing organo peroxide catalyst, namely, dicumyl peroxide, dibenzoyl peroxide or MEK peroxide, was incorporated in the reaction mixture at room temperature, although the catalyst could also have been added at elevated temperatures if desired. The amount of catalyst can be determined by one skilled in the art without the exercise of further invention and is typically based on the desired actual curing rate, working life, and the like. Organo peroxide catalysts miscible with the silicone gum rubber were used in an amount from about 0.5–1% by total weight of composition based on the total amount of silicone gum rubber.

Mixing was accomplished by using a Brabender® Plasticorder kneader and the amounts of conductive particulate filler were selected to provide a target percent by weight of total conductive loading in the electroconductive composition. The manner of adding the conductive material to the silicone gum rubber is not essential. (In the examples demonstrating my invention, silver-covered glass beads were added first followed by the addition of silver-covered glass fibers; a reverse order of addition can also work.) The resulting curable mixture of silicone gum rubber, conductive filler particles and organo catalyst was then placed into a gasket mold where it was pressed at 20,000 lbs of pressure and 350° F. for about 30 minutes then allowed to cool. A gasket was produced which was 7 inches long, 7 inches wide and approximately 0.08 inches thick. Subsequently, the gasket was placed in an oven at about 200° C. for a period of time from about 1 hour to about 4 hours for post curing, i.e., to drive off the volatiles. Four or five strips, each 4 inches long, 0.5 inches wide and approximately 0.08 inches thick, were cut out from each gasket for use as specimens in measuring physical properties such as initial resistivity and hardness. More specifically, the surface resistance of the strips from each gasket was measured with a Walhalla Model 4100 OTC Ohmmeter at four or five locations on each strip, and from these values and the measured thickness an average initial volume resistivity for each gasket was calculated. The hardness of each sample was measured by using a Durometer by Gardner Scientific.

Examples 1–18

Gaskets were prepared described above in the section entitled "Materials and Methods". For each example the following data was recorded: the initial hardness of the silicone gum rubber, the total conductive loading of the composition, the percent by weight of beads and/or fibers in the electroconductive composition, the weight percent of silver coating on the beads and/or fibers, the initial resistivity of the electroconductive composition in mΩ.cm and its hardness as measured in Durometer scales A and D.

Table 1 below summarizes the processing parameters and test results for the tested embodiments.

average diameter of 30μ and a silver coating varying from about 8% by weight to about 20% by weight, with the exception of example 17 in which the silver-coated beads of the filler had a diameter of 66μ. By comparison with the sample tested in example 16, the initial resistivity improved (decreased) when using beads of larger diameter.

On the other hand, examples 1–4, 6, 8–10, 12, 14 and 15 show the physical characteristics of various control embodiments performed with gaskets prepared using, not a combination of electroconductive elongate particles and electroconductive spheroidal particles, but instead only spherical conductive particles or only elongate conductive particles. More specifically, examples 1 and 3 are directed to gaskets having only electroconductive silver-coated beads of average diameter 30μ (commercially available from Potters Industries, Inc.). The silver coating was 16 wt % and the matrix materials were silicone gum rubber from GE Corporation having an initial hardness of 70 and 50, respectively. The remaining control embodiments were gaskets containing only elongate electroconductive particles, namely, silver-coated glass fibers as commercially available from Potters Industries Inc. The fibers had a diameter of 16μ and length of approximately 1/32 inches, with an aspect ratio of 60:1. The silver content of the coating for these fibers varied from about 8% by weight to about 44% by weight.

Examples 19–26

Similar tests were conducted on control embodiments, and on embodiments in accordance with the present invention wherein the conductive filler material contained conductive elongate particles of higher aspect ratio than those

TABLE 1

| Exp. | Initial Rubber Hardness | % Total Conductive Loading | % Beads | Wt. % Ag on Bead | % Fiber | Wt. % Ag on Fiber | Init. Resist. mΩ · cm | Durometer A Scale | Durometer D Scale | Durometer D2 Scale |
|---|---|---|---|---|---|---|---|---|---|---|
| 1. | 70 | 71 | 71.0 | 16 | — | — | 18.2 | 98 | 85 | 41.0 |
| 2. | 70 | 55 | — | — | 55.00 | 27 | 199.2 | 93 | 77 | 33.5 |
| 3. | 50 | 71 | 71.0 | 16 | — | — | 8.3 | 95 | 78 | 33.6 |
| 4. | 50 | 55 | — | — | 55.00 | 27 | 36.1 | 88 | 69 | 25.8 |
| 5. | 50 | 55 | 13.75 | 16 | 41.25 | 27 | 23.0 | 87 | 68 | 25.9 |
| 6. | 50 | 60 | — | — | 60.00 | 27 | 45.7 | 90 | 72 | 27.9 |
| 7. | 50 | 60 | 15.0 | 20 | 45.00 | 27 | 17.1 | 89 | 70 | 27.8 |
| 8. | 50 | 55 | — | — | 55.00 | 44 | Resistive** | 84 | 64 | 25.0 |
| 9. | 50 | 60 | — | — | 60.00 | 44 | Resistive** | 89 | 68 | 26.4 |
| 10. | 50 | 50 | — | — | 50.00 | 30 | 14.1 | 88 | 66 | 23.8 |
| 11. | 50 | 50 | 12.5 | 20 | 37.50 | 30 | 13.7 | 87 | 66 | 23.4 |
| 12. | 50 | 45 | — | — | 45.00 | 30 | 51.6 | — | — | — |
| 13. | 50 | 50 | 12.5 | 16 | 37.50 | 30 | 203.6 | — | — | — |
| 14. | 50 | 55 | — | — | 55.00 | 20 | 24.5 | 88 | 70 | — |
| 15. | 50 | 55 | — | — | 55.00 | 8 | 338.0 | 89 | 71 | — |
| 16. | 50 | 55 | 13.75 | 16 | 41.25 | 20 | 17.3 | 88 | 69 | — |
| 17. | 50 | 55 | 13.75* | 16 | 41.25 | 30 | 14.2 | 88 | 69 | — |
| 18. | 50 | 55 | 13.75 | 8 | 41.25 | 20 | 28.3 | — | 67 | — |

*The spheroidal particles had diameter of 66μ
**Greater than $10^{12}$ mΩ · cm.

Examples 5, 7, 11, 13 and 16–18 show physical characteristics of the electroconductive compositions of the invention wherein the conductive filler material is a mixture of elongate particles and spheroidal particles both coated with silver as the conductive material. In these examples, the elongate conductive particles were silver-coated glass fibers having a 16μ diameter and a length of 1/32 inches as provided by Potters Industries Inc. as Fibertec T-3082. The conductive coating on the fibers varied from about 20% by weight to about 30% by weight silver. Similarly, the conductive spheroidal particles were silver-coated glass beads having an used as conductive filler material in Examples 1–18. More specifically, examples 21–24 were directed to utilizing conductive elongate particles such as Fibertec T-3016 as provided by Potters Industries, Inc., having a diameter of 10μ and a length of 1/16 inch, having a coating constituting 24 weight % of the particle. Table 2 below summarizes initial resistivity and hardness values obtained for the gaskets of examples 19–26, each of such gaskets having the aspect ratios indicated in the Table.

TABLE 2

| Exp. | Initial Rubber Hardness | % Total Conductive Loading | % Beads | Wt. % Ag. on Bead | % Fiber | Wt. % Ag. on Fiber | Initial Resist. mΩ · cm | Durometer A Scale | Durometer D Scale | Durometer D2 Scale |
|---|---|---|---|---|---|---|---|---|---|---|
| 19. | 50 | 55 | — | — | 55.0 | 24.0 | 10.9 | 73 | 91 | 30.6 |
| 20. | 50 | 50 | — | — | 50.0 | 24.0 | 12.0 | — | — | — |
| 21. | 50 | 50 | 25.0 | 16 | 25.0 | 24.0 | 10.8 | 72 | 90 | 28.3 |
| 22. | 50 | 50 | 12.5 | 16 | 37.5 | 24.0 | 14.8 | 70 | 89 | 26.7 |
| 23. | 50 | 55 | 13.75 | 16 | 41.25 | 24.0 | 15.8 | 72 | 92 | 29.0 |
| 24. | 50 | 55 | 27.5 | 16 | 27.5 | 24.0 | 35.9 | — | — | — |
| 25. | 50 | 50 | — | — | 50.0* | 23.0 | 92.6 | 69 | 87 | — |
| 26. | 50 | 60 | — | — | 60.0* | 23.0 | 13.0 | 76 | 92 | — |

*The elongate particles had a diameter 16μ and a length of 1/32 inch.

Examples 19, 20, 25 and 26 are directed to the aforementioned control embodiments. In control examples 19 and 20, the samples were from gaskets prepared in accordance with the section entitled "Materials and Methods" above except that the conductive filler material did not constitute a mixture of electroconductive elongate and spheroidal particles. More specifically, the gaskets tested in examples 19 and 20 were made of an electroconductive composition which included as the conductive filler material only silver coated fibers of at 50% and 55% total conductive loading, respectively. Additionally, in control embodiments 25 and 26, the conductive filler material consisted only of elongate particles of slightly larger diameter, i.e., silver coated fibers commercially available from Potters Industries, Inc. under Fibertec T-3032. These fibers had an aspect ratio of 60:1.

As is readily apparent from Table 2 above, as well as from Table 1, when the ratio of elongate particles to spheroidal particles is 3:1, the initial resistivity improved (decreased) especially for a total conductive loading from about 55% by weight to about 60% by weight. Additionally, the 50 durometer silicone rubber was also rendered softer and hence more flexible. This is supported by examples 5 and 6.

The terms and expressions which have been employed are used as terms of description and not of limitation, and there is no intention in the use of such terms and expressions of excluding any equivalents of the features shown and described, or portions thereof. Thus, while I have described what are the preferred embodiments of the present invention, further changes and modifications can be made by those skilled in the art without departing from the true spirit of the invention, and it is intended that all such changes and modifications as come within the scope of the claims set forth below be so included.

We claim:

1. An electroconductive composition, which comprises an elastic matrix material and particulate filler material dispersed in said matrix material, said particulate filler material comprising a multiplicity of particles having an elongate core or substrate coated with a conductive material and a multiplicity of particles having a spheroidal core or substrate coated with a conductive material, said elongate particles and said spheroidal particles being mutually substantially interspersed, the total amount of said particulate filler material in said composition and the amounts of said elongate particles and said spheroidal particles relative to one another being such that the conductive particles are in electroconductive relationship, and such that the composition is functionally flexible.

2. The composition as defined in claim 1, wherein said composition has a resistivity of no more than 20 mΩ.cm and an average Durometer hardness of no more than 70 on the "D" scale.

3. The composition as defined in claim 1, wherein said composition has an average Durometer hardness 8–30% less than said flexible matrix material containing spheroidal particles sufficient to provide resistivity comparable to said composition.

4. The composition as defined in claim 1, wherein said matrix material comprises rubber.

5. The composition as defined in claim 4, wherein said rubber is a silicone rubber.

6. The composition as defined in claim 5, wherein the rubber is 50 Durometer silicone gum rubber.

7. The composition as defined in claim 5, wherein said silicone rubber contains an organo peroxide catalyst.

8. The composition as defined in claim 1, wherein said composition comprises from 40–70 wt % conductive filler material.

9. The composition as defined in claim 1, wherein said composition comprises from 50–60 wt % conductive filler material.

10. The composition as defined in claim 1, wherein said composition comprises from 50–55 wt % conductive filler material.

11. The composition as defined in claim 1, wherein the weight ratio of elongate particles to spheroidal particles is 2:1 to 4:1.

12. The composition as defined in claim 1, wherein the weight ratio of elongate particles to spheroidal particles is 1:1 to 3:1 and said elongate particles have an aspect ratio of 40:1.

13. The composition as defined in claim 1, wherein the weight ratio of elongate particles to spheroidal particles is 3:1.

14. The composition as defined in claim 1, wherein said elongate particles have a length of from 1/64 to 1/16 inch and a diameter of from 1–50 microns.

15. The composition as defined in claim 1, wherein said elongate particles have a length of 1/32 inch and a diameter of 16 microns.

16. The composition as defined in claim 1, wherein said elongate particles have on average an aspect ratio from 40:1 to 320:1 and said composition has a resistivity less than 200 mΩ.cm and an average Durometer hardness less than 70 ("D" Scale).

17. The composition as defined in claim 1, wherein said elongate particles have an average aspect ratio from 40:1 to 320:1 and said composition has a resistivity less than 36 mΩ.cm and an average Durometer hardness less than 90 ("D" Scale).

18. The composition as defined in claim 1, wherein said elongate particles comprise glass fibers coated with an electroconductive material.

19. The composition as defined in claim 1, wherein said elongate particles are plated with a conductive metal.

20. The composition as defined in claim 1, wherein said elongate particles are coated with a metal selected from the group consisting of Ag, Au, Pt, Pd and Cu.

21. The composition as defined in claim 1, wherein said elongate particles are plated with silver from 15 to 30 wt %.

22. The composition as defined in claim 2, wherein said elongate particles are plated with silver in an amount of from 20 to 27 wt %.

23. The composition as defined in claim 1, wherein said spheroidal particles comprise beads having an average diameter of from 10 to 100 microns.

24. The composition as defined in claim 23, wherein said spheroidal particles comprise beads having an average diameter of from 30 to 75 microns.

25. The composition as defined in claim 24, wherein said spheroidal particles comprise beads having an average diameter ranging from 60 to 70 microns.

26. The composition as defined in claim 1, wherein said spheroidal particles comprise glass core spheroidal particles coated with a conductive layer.

27. The composition as defined in claim 26, wherein said conductive layer comprises silver.

28. The composition as defined in claim 1, wherein said spheroidal particles are plated with a conductive metal.

29. The composition as defined in claim 1, wherein said spheroidal particles are plated with a metal selected from the group consisting of Ag, Au, Pt, Pd and Cu.

30. The composition as defined in claim 1, wherein said spheroidal particles are plated with conductive metal in an amount of from 8 to 24 wt %.

31. The composition as defined in claim 30, wherein said spheroidal particles are plated with silver in an amount of 12 to 20 wt %.

32. A method of making an electroconductive composition, which comprises: compounding into a precursor of a flexible matrix material a particulate filler material including a multiplicity of elongate particles having a core or substrate coated with a conductive material and a multiplicity of spheroidal particles having a core or substrate coated with a conductive material, such that the elongate conductive particles and the spheroidal conductive particles are mutually substantially interspersed in the precursor; and curing the precursor to form said flexible matrix; the total amount of said particulate filler material and the amounts of said elongate particles and said spheroidal particles relative to one another being such that the conductive particles in said electroconductive composition after curing are in electroconductive relationship, and the composition os functionally flexible.

33. The method as defined in claim 32, wherein said precursor material is a precursor of rubber matrix material.

34. The method as defined in claim 33, wherein said precursor material is a precursor of a silicone rubber.

35. The method as defined in claim 32, wherein said precursor is cured with an organoperoxide catalyst.

36. The method as defined in claim 32, wherein said conductive filler material is incorporated in an amount such that said filler material constitutes from 40–70 wt % of said electroconductive composition.

37. The method as defined in claim 32, wherein the weight ratio of conductive elongate particles to conductive spheroidal particles compounded into said precursor is from 2:1 to 4:1.

38. The method as defined in claim 32, wherein the weight ratio of conductive elongate particles to conductive spheroidal particles compounded into said precursor is from 1:1 to 3:1.

39. The method as defined in claim 32, wherein said elongate particles have an average aspect ratio from 40:1 to 320:1.

40. The method as defined in claim 32, wherein said elongate particles comprise glass fibers coated with an electroconductive material.

41. The method as defined in claim 32, wherein said spheroidal particles have an average diameter of from 10 to 100 microns.

42. The method as defined in claim 32, wherein said spheroidal particles comprise glass beads coated with an electroconductive material.

43. An electroconductive composition, which comprises an elastic matrix and particulate filler material dispersed in said matrix material, said particulate filler material comprising a multiplicity of particles having an elongate core or substrate coated with a conductive material and a multiplicity of particles having a spheroidal core or substrate coated with a conductive material, said elongate particles and said spheroidal particles being mutually substantially interspersed, the total amount of said particulate filler material in said composition and the amounts of said elongate particles and said spheroidal particles relative to one another being such that the conductive particles are in electroconductive relationship, and such that the composition is functionally flexible, wherein the weight ratio of elongate particles to spheroidal particles is 1:1 to 4:1.

44. An electroconductive composition, which comprises an elastic matrix and particulate filler material dispersed in said matrix material, said particulate filler material comprising a multiplicity of particles having an elongate core or substrate coated with a conductive material and a multiplicity of particles having a spheroidal core or substrate coated with a conductive material, said elongate particles and said spheroidal particles being mutually substantially interspersed, the total amount of said particulate filler material in said composition and the amounts of said elongate particles and said spheroidal particles relative to one another being such that the conductive particles are in electroconductive relationship, and such that the composition is functionally flexible, wherein the weight ratio of elongate particles to spheroidal particles is 2:1 to 4:1.

45. An electroconductive composition, which comprises an elastic matrix and particulate filler material dispersed in said matrix material, said particulate filler material comprising a multiplicity of particles having an elongate core or substrate coated with a conductive material and a multiplicity of particles having a spheroidal core or substrate coated with a conductive material, said elongate particles and said spheroidal particles being mutually substantially interspersed, the total amount of said particulate filler material in said composition and the amounts of said elongate particles and said spheroidal particles relative to one another being such that the conductive particles are in electroconductive relationship, and such that the composition is finctionally flexible, wherein the weight ratio of elongate particles to spheroidal particles is 1:1 to 3:1.

46. A method of making an electroconductive composition, which comprises: compounding into a precursor of a flexible matrix material a particulate filler material including a multiplicity of elongate particle shaving a core or substrate coated with a conductive material and a multiplicity of spheroidal particles having a core or substrate coated with a conductive material, such that the elongate conductive particles and the spheroidal conductive particles are mutually substantially interspersed in the precursor; and curing the precursor to form said flexible matrix; the total amount of said particulate filler material and the amounts of said elongate particles and said spheroidal particles relative to one another being such that the conductive particles in said electroconductive composition after curing are in electroconductive relationship, and the composition is functionally flexible, wherein the weight ratio of elongate particles to spheroidal particles is 1:1 to 4:1.

* * * * *

UNITED STATES PATENT AND TRADEMARK OFFICE
CERTIFICATE OF CORRECTION

PATENT NO.    : 6,533,963 B1
DATED         : March 18, 2003
INVENTOR(S)   : Schleifstein et al.

It is certified that error appears in the above-identified patent and that said Letters Patent is hereby corrected as shown below:

<u>Title page,</u>
Before Item [*] Notice, insert -- [73] Assignee: Potters Industries, Inc., Carlstadt, NJ (US) --; and
Before Item [57] ABSTRACT, insert -- [74] *Attorney, Agent, or Firm*-Winston & Strawn. --

<u>Column 21,</u>
Line 48, delete "os" and insert -- is --.

<u>Column 22,</u>
Lines 55-56, delete "finctionally' and insert -- functionally --; and
Line 61, delete "particle shaving" and insert -- particles having --.

Signed and Sealed this

Seventeenth Day of August, 2004

JON W. DUDAS
*Acting Director of the United States Patent and Trademark Office*